United States Patent
Vere et al.

(10) Patent No.: US 6,281,048 B1
(45) Date of Patent: Aug. 28, 2001

(54) METHOD OF MAKING AN ELECTRONIC COMPONENT, AND AN ELECTRONIC COMPONENT

(75) Inventors: Denis Vere, Orléans; Sophie Girard, Orléans la Source, both of (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 09/295,118

(22) Filed: Apr. 19, 1999

(30) Foreign Application Priority Data

Apr. 30, 1998 (FR) .................................................. 98 05484

(51) Int. Cl.[7] .......................... H01L 21/44; H01L 21/48; H01L 21/50
(52) U.S. Cl. ........................................... 438/118; 438/119
(58) Field of Search ............................. 257/783; 438/118, 438/119

(56) References Cited

U.S. PATENT DOCUMENTS

| | | |
|---|---|---|
| 4,955,132 | 9/1990 | Ozawa . |
| 5,566,441 | * 10/1996 | Marsh et al. . |
| 5,672,542 | 9/1997 | Schwiebert et al. . |

FOREIGN PATENT DOCUMENTS

| | | |
|---|---|---|
| 0 449 496 | 10/1991 | (EP) . |
| 0 704 899 | 4/1996 | (EP) . |
| 0 810 649 | 12/1997 | (EP) . |
| WO 97/27646 | 7/1997 | (WO) . |

* cited by examiner

Primary Examiner—David E. Graybill
(74) Attorney, Agent, or Firm—Frishauf, Holtz, Goodman, Langer & Chick, P.C.

(57) ABSTRACT

A method of making an electronic component, in particular a contactless card which includes an antenna. The card has an insulating substrate provided with conductive tracks, and a semiconductor chip mounted on the substrate. Conductive tracks are formed on the substrate by screen printing using a conductive ink. A semiconductor chip as provided with contact areas is supplied, and conductive terminals, or "bumps", are formed on at least some of the contact areas. The chip is disposed on the substrate, before the conductive ink is dry, so that the ends of the bumps penetrate into the ink at the corresponding locations. The chip is fixed mechanically to the substrate by polymerizing an insulating adhesive resin disposed between the bottom face of the chip and the top face of the substrate.

7 Claims, 2 Drawing Sheets

METHOD OF MAKING AN ELECTRONIC COMPONENT, AND AN ELECTRONIC COMPONENT

FIELD OF THE INVENTION

The present invention relates to a method of making an electronic component, and to an electronic component of the type obtained by implementing said method. More precisely, the invention relates to making a component which comprises an insulating substrate provided with conductive tracks, and at least one semiconductor chip mounted on said insulating substrate.

BACKGROUND OF THE INVENTION

Many examples are known in which a semiconductor chip is mounted on a printed circuit, in particular a printed circuit of small size. For example, this applies to electronic memory cards, regardless of whether they are of the "contact" type or of the "contactless" type, i.e. of the type in which data and energy are conveyed between the card and the reader by electromagnetic waves.

In a contact type of electronic memory card, the conductive tracks of the printed circuit serve to connect the external contact areas of the card to the terminals of the semiconductor chip so as to form an electronic module. In a contactless type of electronic memory card, the metal-plating serves as the antenna of the card and to connect the card to the semiconductor chip.

For all of these applications and for many other applications, known techniques for forming the conductive tracks of the printed circuit involve depositing a copper pattern on or fixed to a flexible or rigid insulating support, which copper pattern includes copper wires or wires made of some other metal, or in disposing a copper film which is then chemically etched to obtain the desired tracks. The chip is then fixed to the corresponding zone of the printed circuit.

Such techniques for making the printed circuit are relatively costly, whereas the manufacturing cost of the card, and thus of the module including the semiconductor die, must be as low as possible.

SUMMARY OF THE INVENTION

An object of the invention is to make an electronic is component comprised of a printed circuit element to which at least one semiconductor chip or die is fixed, in such a way that the manufacturing cost is low compared with the costs of known techniques.

These and other objects are attained in accordance with one aspect of the invention by making an electronic component of the chip card type, comprising an insulating substrate provided with an antenna-forming conductive track, and a semiconductor chip mounted on said substrate. The antenna-forming conductive track is formed on the substrate by screen printing using a polymerizable conductive ink. A semiconductor chip as provided with contact areas is supplied. Conductive terminals such as "bumps" are formed on at least some of the contact areas. The chip is disposed on the substrate, before the conductive ink is dry, so that the ends of the bumps penetrate into the ink at the corresponding locations.

Advantageously, the chip is fixed mechanically to the substrate by polymerizing an insulating adhesive resin disposed between the bottom face of the chip and the top face of the substrate.

It can be understood that, by forming the conductive tracks of the printed circuit by screen printing using a conductive ink, it is possible to reduce the cost very significantly compared with conventional techniques using metal plating that is then etched, or in which a pre-cut copper sheet is applied.

It can also be understood that, since the semiconductor chip as provided with its projecting connection terminals is put in place before the screen-printed ink is dry, very good electrical contact is achieved between the chip and the conductive tracks, without it being necessary to use a conductive adhesive, as is necessary in prior techniques.

In a first implementation, the adhesive resin is disposed between the substrate and the chip after the chip has been put in place on the substrate.

In a second implementation, the insulating adhesive resin is disposed on the bottom face of the chip before the chip is put in place on the substrate.

Another aspect of the invention provides an electronic component comprising an insulating substrate provided with a conductive track formed with a conductive ink, a semiconductor chip provided with contact areas, and mechanical fixing means for fixing the chip mechanically to the substrate, wherein at least some of the contact areas are provided with respective conductive terminals such as bumps, and wherein the ends of the bumps penetrate into the conductive ink serving to form said tracks.

It can be understood that a component is thus obtained in which the electrical connection between the chip and the conductive track results from the ends of the bumps penetrating into the ink forming the conductive tracks.

DETAILED DESCRIPTION OF THE INVENTION

Figure 1:
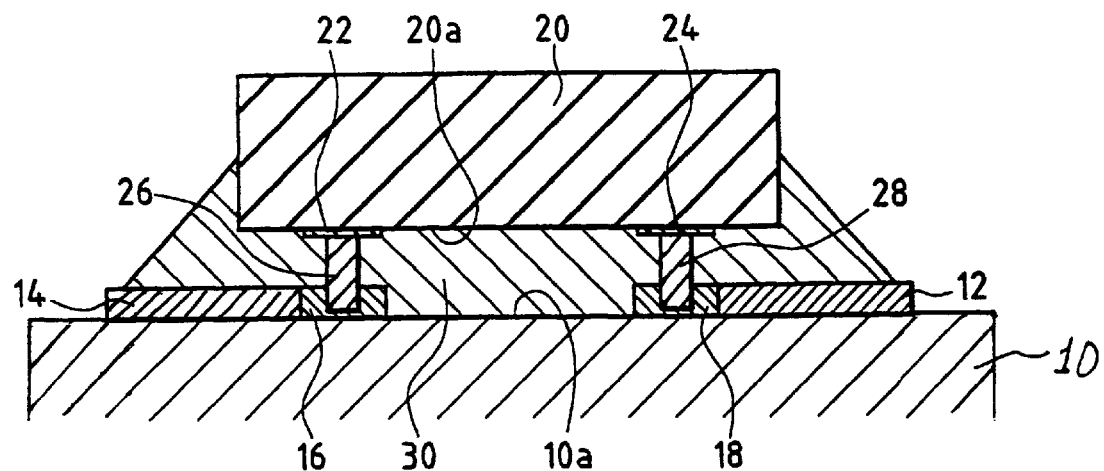
FIG. 1 is a vertical section of a chip fixed in accordance with the invention to a printed circuit and taken along line I—I in FIG. 2.

With reference firstly to FIG. 1, a description follows of the various steps of the method of making the electronic component made up of the printed circuit and of a semiconductor chip. Firstly, conductive track 11 (see FIG. 2) and its conductive track end portions 12, 14 are formed on an insulating substrate 10 which may be flexible or rigid. The conductive track end portions also include connection terminals 16, 18 for connecting the semiconductor chip 20 to the conductive track end portions 12 and 14. According to an essential characteristic of the invention, the conductive track 11 is formed by screen-printing using a conductive ink printed through a screen. The implementation of the screen-printing operation is explained in more detail below. Such inks are known per se, and they are thermoplastic or thermosettable polymerizable compounds filled with metal particles. A preferred example of such an ink is epoxy ink which includes silver.

In addition, connection terminals such as 26 and 28 are formed to project from contact areas 22 and 24 on the bottom face 20a of the semiconductor chip 20. These terminals 26, 28 are often referred to as "bumps". Advantageously, the bumps 26 and 28 may be obtained by a screen-printing technique using a conductive ink applied to the bottom face 20a of the semiconductor chip.

After the conductive track 11 and the bumps 26 and 28 have been formed, the semiconductor chip 20 is put in place in a manner such that the bumps 26 and 28 face the connection terminals 16 and 18 of the conductive track 11. The chip 20 is put in place in this way before the screen-printed ink constituting the conductive track 11 is dry, i.e. while it is still in a viscous state and not totally solidified. At such time, bumps 26, 28 are preferably already dry. It is thus possible for the free ends of the bumps 26 and 28 to penetrate into the conductive ink of connection terminals 16 and 18, thereby guaranteeing very good electrical contact between the two members. In a subsequent step, an adhesive insulating resin 30 is inserted between the bottom face 20a of the chip 20 and the top face 10a of the substrate 10. This is accomplished with a needle-tipped instrument containing a calibrated drop of resin which is used to inject the resin under chip 20. When polymerized, this resin provides a mechanical bond between the substrate 10 and the chip 20.

It can be understood that the desired assembly is thus obtained, made up of the substrate 10, of the conductive track 11 and of the semiconductor chip 20 which is connected electrically to the conductive tracks and which is secured mechanically to the substrate.

In a variant, it is possible to deposit a layer of insulating adhesive material on the bottom face of the chip, and to put the chip as prepared in this way in place on the substrate.

Figure 2:
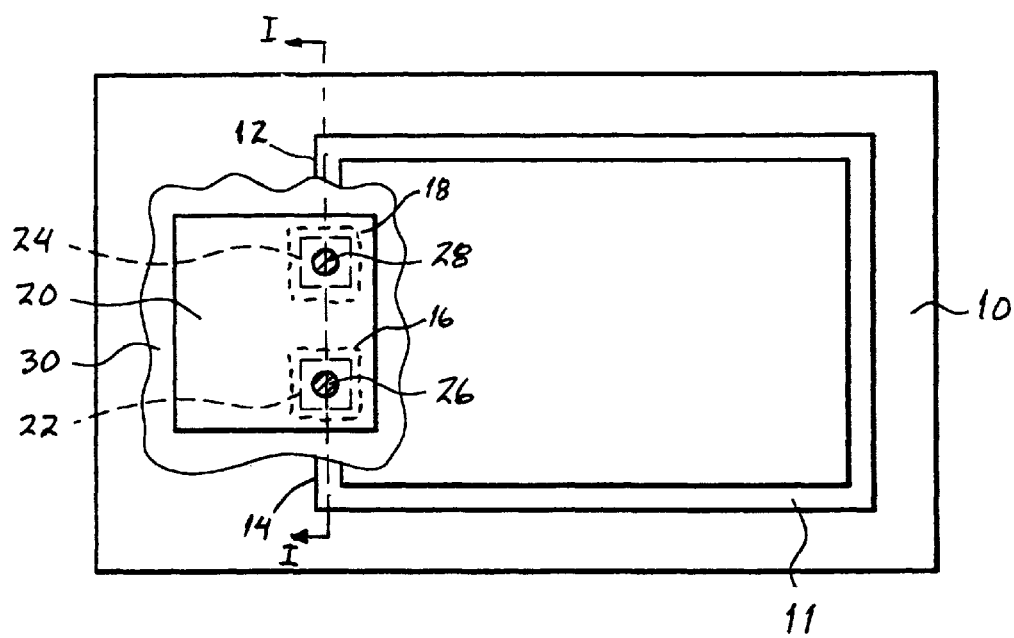
FIG. 2 is a plan view of the arrangement shown in FIG. 1.

FIG. 2 shows an example of electronic components that can be made by the above-described technique. This figure shows the insulating substrate 10 on which a substantially rectangular closed conductive track 11 is formed to constitute an antenna. The conductive track 11 is provided with two connection terminals 16 and 18 for engaging connection terminals, or bumps, 26 and 28 extending from contact areas 22 and 24 on a semiconductor chip 20. This figure also shows the insulating adhesive material 30.

Figure 3:
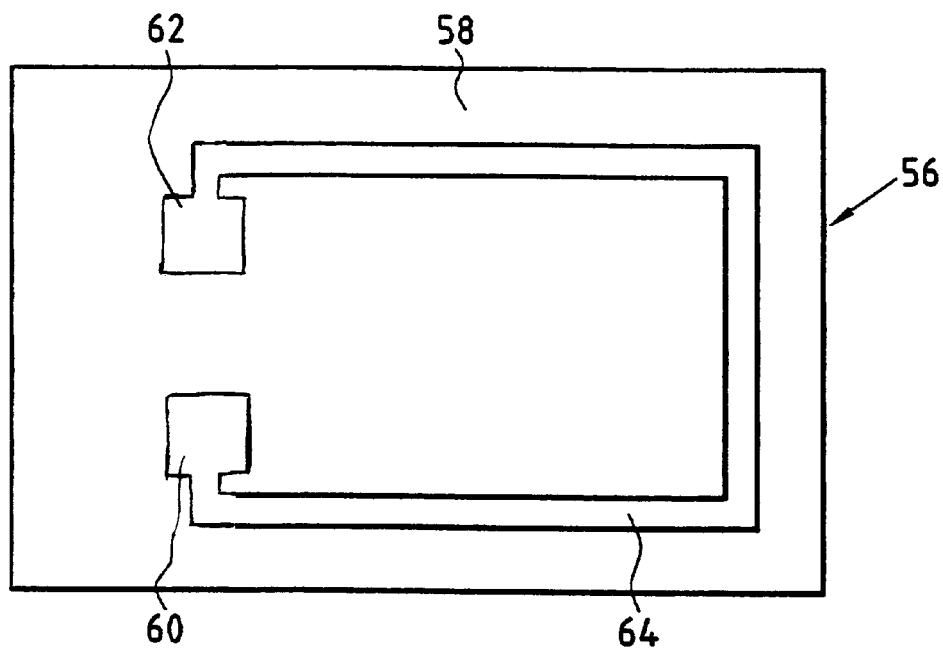
FIG. 3 is a plan view of a first embodiment of the screen-printing screen for forming the conductive track.

With reference to FIG. 3, a description follows of a first embodiment of the screen 56 serving to form the conductive track 11 with its connection terminals 16 and 18 by screen printing. The mask 56 is constituted by a sheet of steel or of polyester 58 provided with two windows 60 and 62 corresponding to the zones in which the connection terminals 16 and 18 are to be formed, and with a plotted path 64 corresponding to the shape of the conductive track 11 to be formed. The plotted path 64 is constituted by micro-perforations provided in the sheet 58. The diameter of the micro-perforations is preferably about 50 $\mu$m and they are spaced apart by approximately 30 $\mu$m on average. Thus, during the screen printing with the conductive ink, more ink is deposited in the windows 60 and 62 corresponding to the connection terminals 16 and 18 than in the ordinary portion 64 of the metal plating. An alternative approach to using windows 60 and 62 is to also use micro-perforations, but which are sized to permit a relatively greater deposit of ink than for the track 11. In addition, connection terminals 16, 18 could be made the same width as the remainder of track 11 rather than being wider. However, the larger width facilitates registration with and penetration by bumps 26 and 28.

Figure 4A:
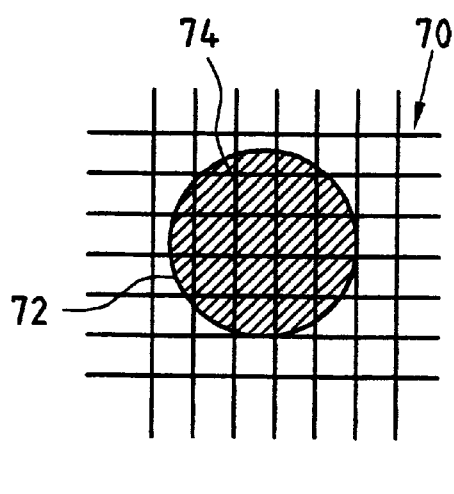
FIGS. 4a and 4b are fragmentary views showing a second embodiment of the screen-printing screen.
Figure 4B:
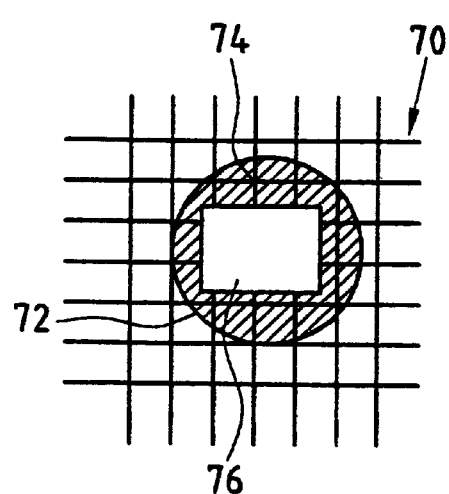

FIGS. 4a and 4b show another embodiment of the screen-printing screen. In this embodiment, a conventional screen constituted by a mesh of fibers 70, e.g. made of polyester, is used. In the zone in which more ink is to be deposited, which zone is represented by the circle 72 in FIG. 4a, namely for connection terminals 16 and 18, the fibers are welded together at their nodes 74. After welding the fibers in this zone, a window 76 (FIG. 4b) is cut out of the screen to correspond to the exact zone in which more ink is to be deposited. Naturally, the zone 72 in which the fibers are welded at their nodes must encompass the window 76 to be cut out.

What is claimed is:

1. A method of making an electronic component of the chip card type, comprising an insulating substrate provided with antenna-forming conductive tracks, and a semiconductor chip mounted on said substrate, said method comprising the steps of:

forming the antenna-forming conductive tracks on the substrate by screen printing using a polymerizable conductive ink;

providing the semiconductor chip which has contact areas thereon;

forming conductive terminals on at least some of said contact areas; and disposing said chip on the substrate, after said step of forming the tracks but before said conductive ink is dry, so that ends of said terminals penetrate into the ink.

2. A method according to claim 1, wherein said chip is fixed mechanically to said substrate by polymerizing an insulating adhesive resin disposed between a bottom face of the chip and a top face of the substrate.

3. A method according to claim 2, wherein said adhesive resin is disposed between the substrate and the chip after the chip has been put in place on the substrate.

4. A method according to claim 2, wherein said insulating adhesive resin is disposed on the bottom face of the chip before the chip is put in place on the substrate.

5. A method according to claim 1, wherein the contact terminals are formed by screen printing on the bottom face of the chip.

6. A method according to claim 1, wherein, for forming the conductive tracks by screen printing, a sheet is used in which the zones corresponding to the tracks are defined by micro-perforations, and the zones corresponding to the connection areas are defined by windows.

7. A method according to claim 1, wherein, for forming the screen for screen printing the conductive tracks and the connection terminals, a screen made up of a mesh of plastics fibers is used, the fibers are welded together in the zone that includes the area in which a connection area is to be formed, and the portion corresponding to said area is cut out from said zone.

* * * * *